US009097761B2

(12) United States Patent
Yasuta et al.

(10) Patent No.: US 9,097,761 B2
(45) Date of Patent: Aug. 4, 2015

(54) CHIP STACK DEVICE TESTING METHOD, CHIP STACK DEVICE REARRANGING UNIT, AND CHIP STACK DEVICE TESTING APPARATUS

(75) Inventors: Katsuo Yasuta, Tokyo (JP); Yuji Miyagi, Tokyo (JP)

(73) Assignee: KABUSHIKI KAISHA NIHON MICRONICS, Tokyo (JP)

(*) Notice: Subject to any disclaimer, the term of this patent is extended or adjusted under 35 U.S.C. 154(b) by 486 days.

(21) Appl. No.: 13/293,354

(22) Filed: Nov. 10, 2011

(65) Prior Publication Data

US 2012/0126844 A1 May 24, 2012

(30) Foreign Application Priority Data

Nov. 24, 2010 (JP) ................................. 2010-261448

(51) Int. Cl.
*G01R 31/02* (2006.01)
*G01R 31/28* (2006.01)
*G01R 31/26* (2014.01)

(52) U.S. Cl.
CPC .................................. *G01R 31/2893* (2013.01)

(58) Field of Classification Search
CPC .................................................. G01R 31/2893
USPC ........ 324/756.07, 762.01–763.01; 438/14, 15
See application file for complete search history.

(56) References Cited

U.S. PATENT DOCUMENTS

| 6,307,259 B1 * | 10/2001 | Asada et al. ................... 257/691 |
| 6,573,112 B2 * | 6/2003 | Kono et al. ...................... 438/14 |
| 2002/0095999 A1 * | 7/2002 | Birkner et al. ............... 73/865.8 |
| 2010/0064510 A1 * | 3/2010 | Narita et al. .................... 29/739 |

FOREIGN PATENT DOCUMENTS

| JP | 2000-100882 A | 4/2000 |
| JP | 2001-91576 A | 4/2001 |

* cited by examiner

*Primary Examiner* — Melissa Koval
*Assistant Examiner* — Farhana Hoque
(74) *Attorney, Agent, or Firm* — Bacon & Thomas, PLLC

(57) ABSTRACT

A plurality of chip stack devices having different external sizes can be tested accurately and efficiently with low cost. The present invention provides a chip stack device testing method testing a chip stack device configured by stacking a plurality of chips separated by dicing a substrate under test tested in a testing unit. A tray for chip stack devices having equal shape and external dimension to those of the undiced substrate under test is used, one or a plurality of the chip stack devices are attached and supported to an adhesive layer of the tray for chip stack devices to align the chip stack devices with positions of the respective chips of the undiced substrate under test, the tray for chip stack devices is installed in the testing unit in a similar manner to that in a test of the substrate under test, and the respective chip stack devices are tested.

9 Claims, 7 Drawing Sheets

CHIP STACK DEVICE TESTING METHOD, CHIP STACK DEVICE REARRANGING UNIT, AND CHIP STACK DEVICE TESTING APPARATUS

CROSS-REFERENCE TO RELATED APPLICATION

This application claims, under 35 USC 119, priority of Japanese Application No. 2010-261448 filed on Nov. 24, 2010.

BACKGROUND OF THE INVENTION

1. Technical Field Relating to the Invention

The present invention relates to a chip stack device testing method testing a chip stack device, a chip stack device rearranging unit, and a chip stack device testing apparatus.

2. Description of Related Art

There is a case in which a plurality of chips on a tested wafer are cut and thereafter tested again.

That is, there is a case in which, after a wafer is cut into chips, these chips are picked up and tested, for the purpose of testing only good chips further strictly. In this case, a tray that supports the plurality of cut chips is required. Examples of such a tray include examples in Patent Document 1 (Japanese Patent Laid-Open No. 2001-91576) and Patent Document 2 (Japanese Patent Laid-Open No. 2000-100882).

First, an invention in Patent Document 1 will be described based on FIG. 1. A base 1 houses a tray 2 in which chips are aligned and supported. To the base 1 is attached a lid 4 by a hinge 3. The back surface of the lid 4 is provided with elastic bodies 5. The elastic bodies 5 absorb a thickness variation of the plurality of chips.

In the tray 2, as many openings 6 as the predetermined number of integrated chips N (16 chips in this example) are formed with predetermined spaces. The openings 6 are formed at positions to dispose the chips to have sizes in conformity with the dimensions of the chips. A tray cover 7 covers the upper side of the tray 2 having the chips disposed in the openings 6.

A contactor 8 supports the chips mounted in the openings 6 of the tray 2 from the lower side. The surface of the contactor 8 has protruded fine probe portions 9 at positions corresponding to electrode pads of the respective chips inserted and mounted in the openings 6 of the tray 2.

The tray 2 is loaded in a testing unit as the base 1 is closed by the lid 4.

Next, an invention in Patent Document 2 will be described based on FIG. 2. A tray 11 has chips 13 mounted in openings 12 thereof, is sandwiched and supported by a contactor 14 and a base 15 from the upper and lower sides, and is loaded in a testing unit.

SUMMARY OF THE INVENTION

Meanwhile, each of the aforementioned trays 2 and 11 is configured to dispose and test diced chips one by one. Accordingly, the trays 2 and 11 in the references have no problems in a case where chips are tested one by one.

However, in a case of a chip stack device configured by stacking a plurality of chips, the respective stacked chips may be displaced from one another, or the finishing accuracy at the circumferential part of each chip may be low. This differentiates the external size per chip stack device. When a plurality of such chip stack devices are disposed in the aforementioned tray to test the chip stack devices simultaneously, positions of the respective contact pads on the upper side surface (uppermost chip) of the chip stack device with respect to the end surface of the tray differ with each chip stack device. This makes it difficult to align the respective contact pads with respective probes of the testing unit. In other words, when the external size of the chip stack device differs with each chip stack device, the positions of the respective contact pads on the upper side surface differ with each chip stack device abutting on the end surface of the tray, which causes a problem in which it is difficult to align the respective contact pads with the respective probes of the testing unit.

Also, in a case where measurement is performed by a dedicated unit using a method of repeating filling of chips in the tray 2 or 11, measurement, and refilling, the following problems are raised.

(1) The cost for the dedicated unit increases. Also, in a case of using the dedicated unit, the difference in time in a case where handling time is longer than test time is standby time of the tester, which is wasted time, and the operation efficiency is poor.

(2) The tray 2 or 11 is expensive since it is processed in high accuracy. Also, a dedicated tray needs to be produced each time a device type is changed, which increases the cost.

(3) The tray accuracy needs to be maintained and managed, which increases the cost.

The present invention is accomplished by taking such problems as mentioned above into consideration thereof, and an object thereof is to provide a chip stack device testing method, a chip stack device rearranging unit, and a chip stack device testing apparatus that can test a plurality of chip stack devices having different external sizes accurately and efficiently with low cost.

To solve the above problems, a chip stack device testing method according to the present invention is a chip stack device testing method testing a chip stack device configured by stacking a plurality of chips separated by dicing a substrate under test tested in a testing unit, including using a tray for chip stack devices having equal shape and external dimension to those of the undiced substrate under test and having an adhesive layer on a surface, attaching and supporting one or a plurality of the chip stack devices to the adhesive layer of the tray for chip stack devices to align the chip stack devices with positions of the respective chips of the undiced substrate under test, and installing the tray for chip stack devices in the testing unit in a similar manner to that in a test of the substrate under test and testing the respective chip stack devices attached to the adhesive layer.

Also, a chip stack device rearranging unit is a unit rearranging a chip stack device configured by stacking a plurality of chips separated by dicing a substrate under test tested in a testing unit, including a rearranging stage supporting a tray for chip stack devices that supports the chip stack device and is installed in the testing unit in a similar manner to that in a test of the substrate under test, and a device pick-and-place unit transferring the chip stack device from a device tray housing the chip stack device to an adhesive layer of the tray for chip stack devices supported on the rearranging stage to align the chip stack device with a position of each chip of the undiced substrate under test.

Also, a chip stack device testing apparatus is an apparatus testing a chip stack device, including a chip stack device rearranging unit matching the chip stack device configured by stacking a plurality of chips separated by dicing a substrate under test with a position of each chip of the undiced substrate under test and rearranging the chip stack device in a tray for chip stack devices, a testing unit testing each of the chip stack devices on the tray for chip stack devices, and a carrying-outside device pick-and-place unit transferring each of the tested chip stack devices on the tray for chip stack devices to a device tray.

With the above configuration, a plurality of chip stack devices having different external sizes can be tested accurately and efficiently with low cost.

BRIEF DESCRIPTION OF THE DRAWINGS

Those and other objects, features and advantages of the present invention will become more readily apparent from the following detailed description when taken in conjunction with the accompanying drawings wherein.

DESCRIPTION OF THE PREFERRED EMBODIMENTS

Figure 1:
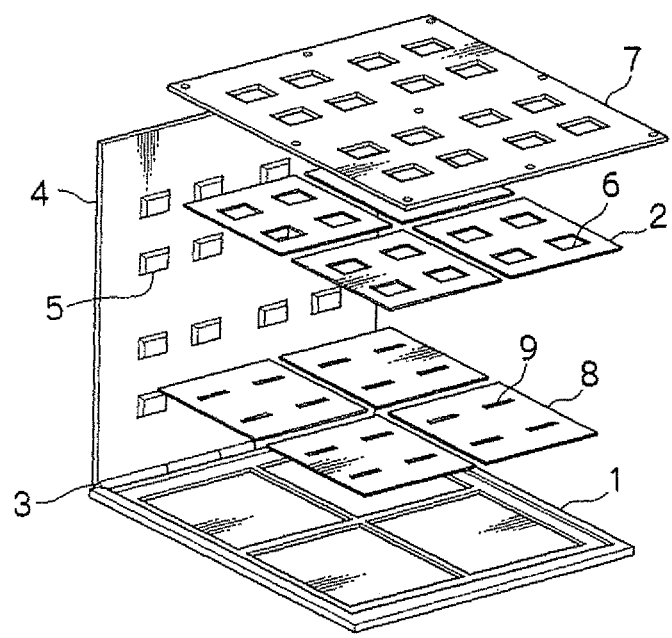
FIG. 1 is a perspective view showing a tray in a first conventional example.
Figure 2:
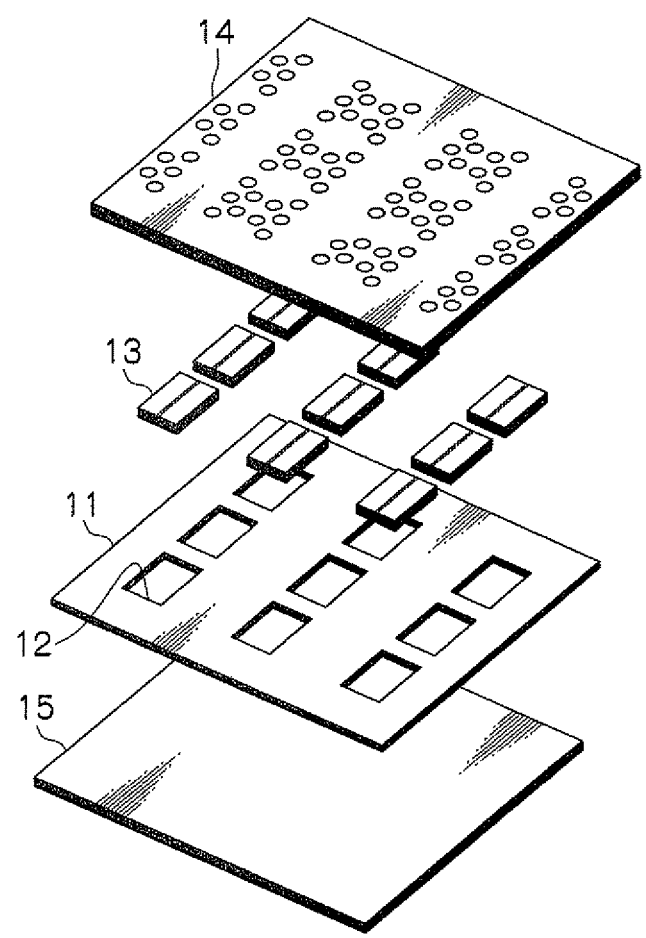
FIG. 2 is a perspective view showing a tray in a second conventional example.
Figure 3:
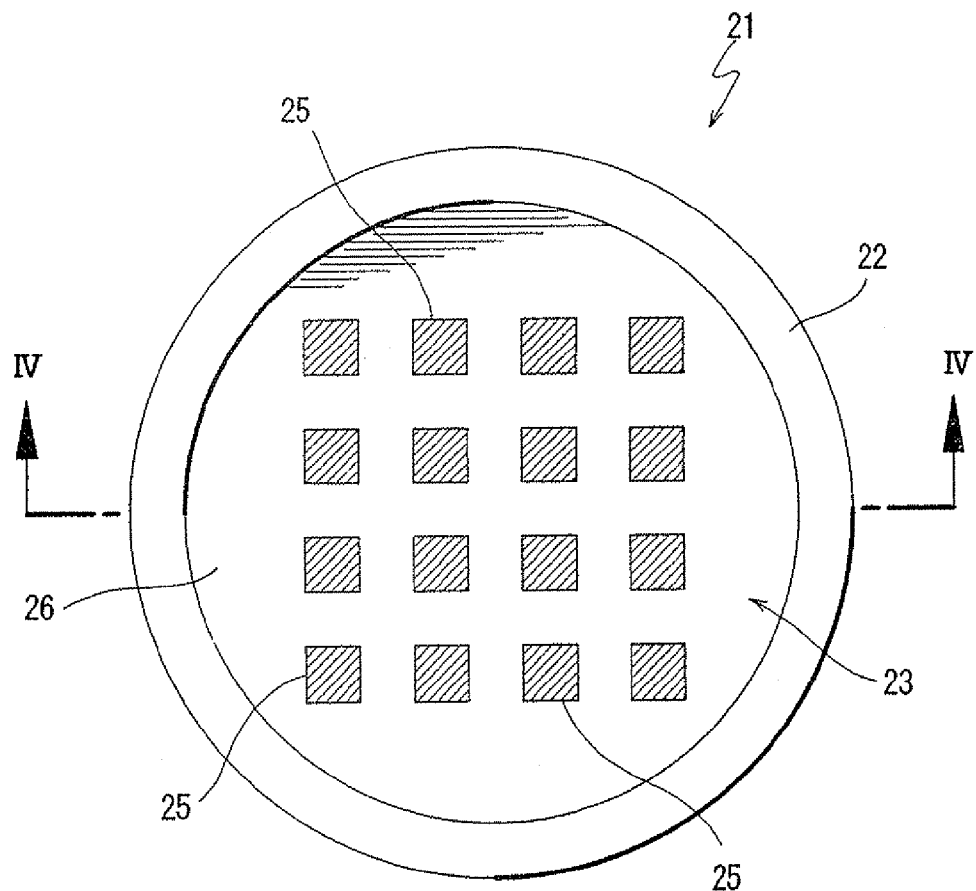
FIG. 3 is a plan view showing a sheet tray for chip stack devices according to an embodiment of the present invention.
Figure 4:
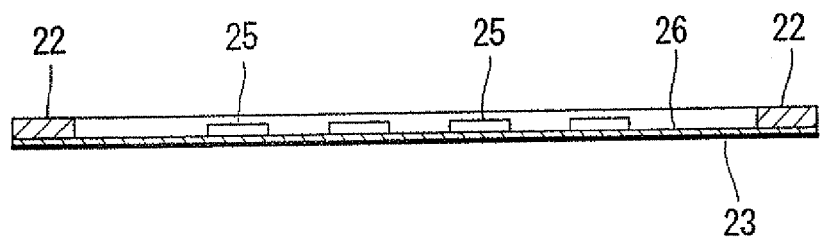
FIG. 4 is a cross-section view taken in the direction of the arrows substantially along the line IV-IV of FIG. 3.
Figure 5:
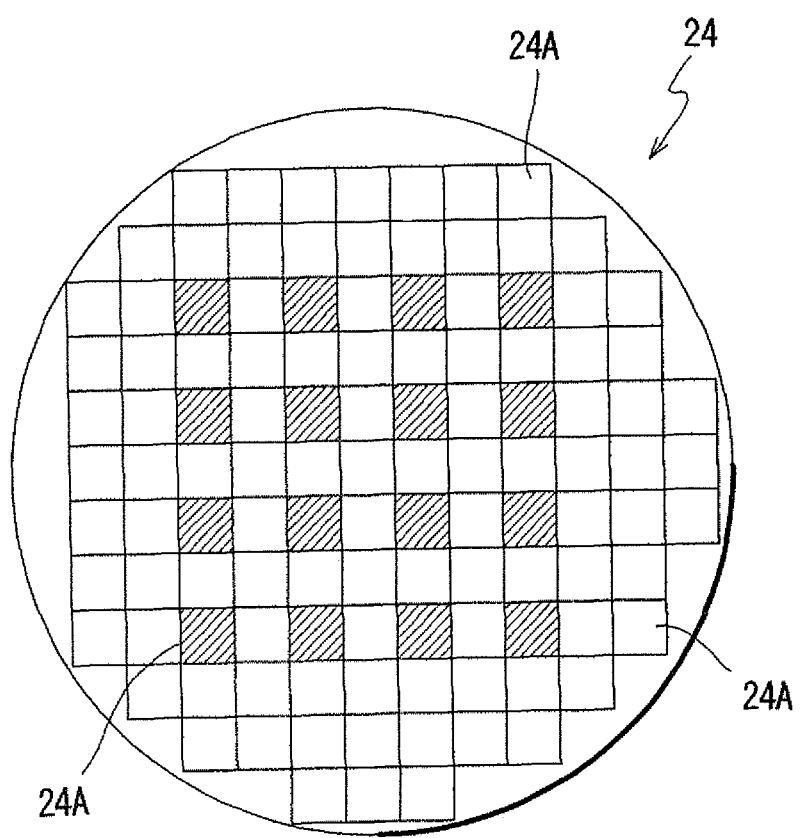
FIG. 5 is a plan view showing a wafer.
Figure 6:
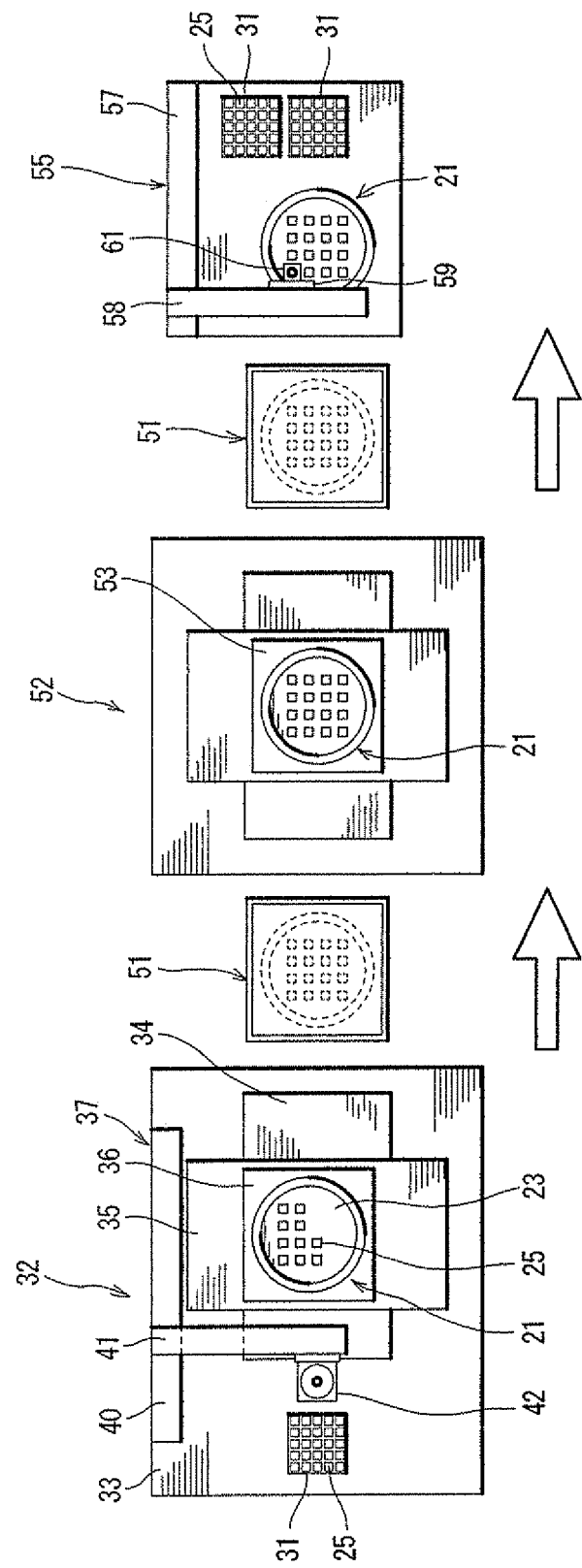
FIG. 6 is a process chart showing a chip stack device testing method according to an embodiment of the present invention.
Figure 7:
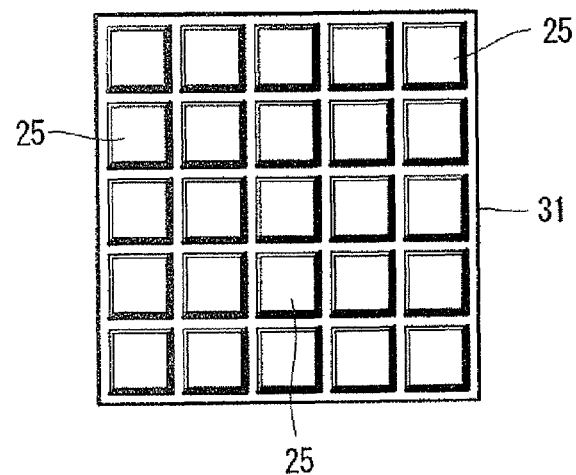
FIG. 7 is a plan view showing a device tray.
Figure 8:
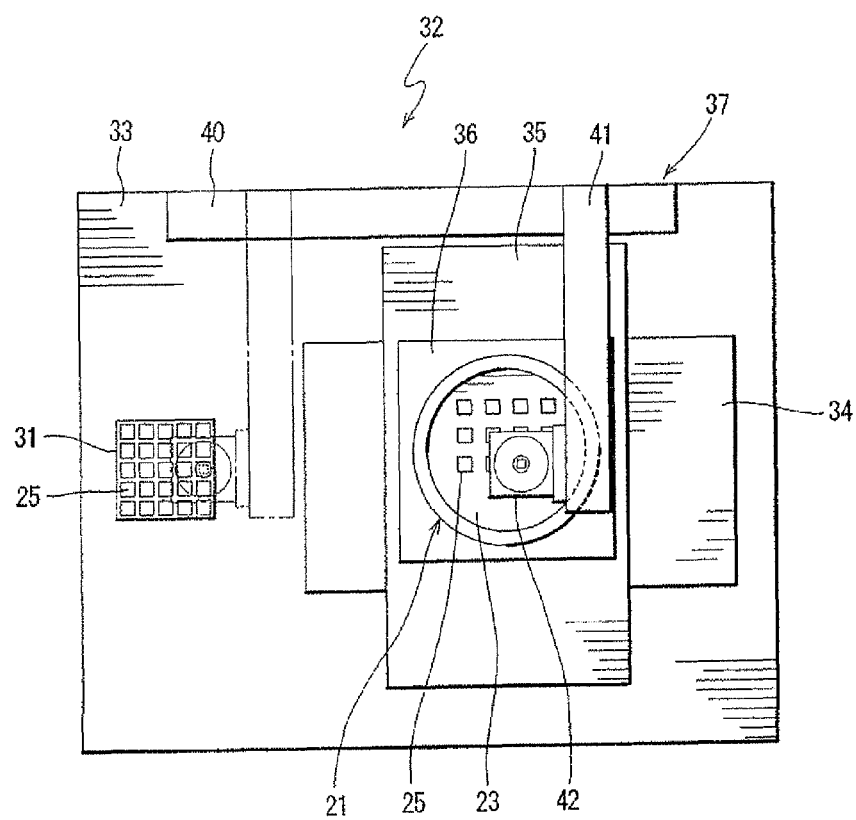
FIG. 8 is a plan view showing a chip stack device rearranging unit according to an embodiment of the present invention.
Figure 9:
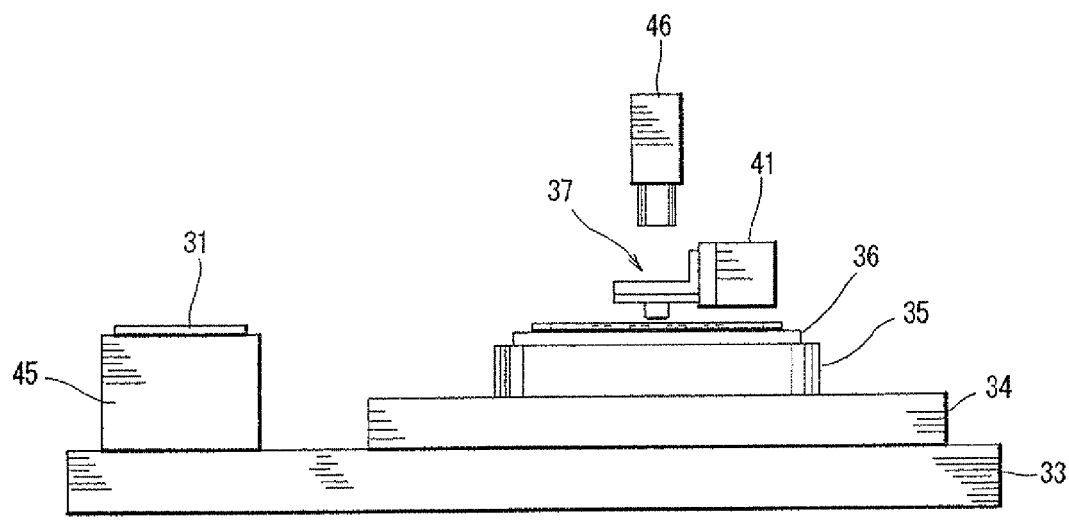
FIG. 9 is a front view showing the chip stack device rearranging unit according to the embodiment of the present invention.
Figure 10:
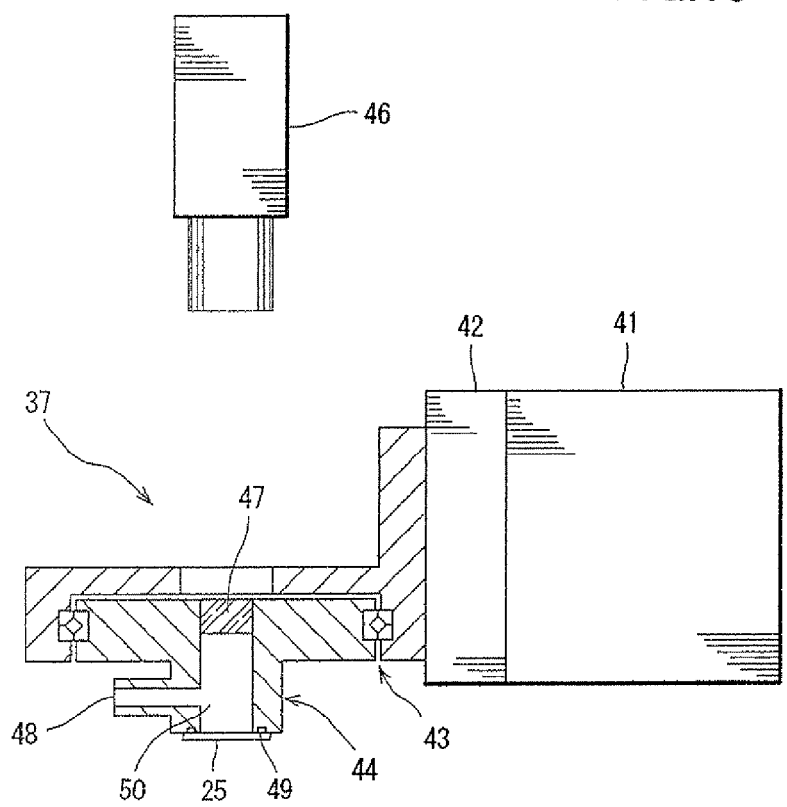
FIG. 10 is a partial cross-sectional view showing a main part of a device pick-and-place unit according to an embodiment of the present invention.

Hereinafter, a chip stack device testing method, a chip stack device rearranging unit, and a chip stack device testing apparatus according to the embodiments of the present invention will be described with reference to the attached drawings. It is to be noted that a chip stack device is a device in which a plurality of respective chips separated by dicing a substrate under test such as a wafer are stacked and integrated, and in which circuits of the respective chips are connected to one another by a through silicon via (TSV) or the like. Also, although various kinds of substrates under test exist, a wafer is taken as an example herein. FIG. 3 is a plan view showing a sheet tray for chip stack devices according to the present embodiment, FIG. 4 is a cross-section view taken in the direction of the arrows substantially along the line IV-IV of FIG. 3, FIG. 5 is a plan view showing a wafer, FIG. 6 is a process chart showing a chip stack device testing method according to the present embodiment, FIG. 7 is a plan view showing a device tray, FIG. 8 is a plan view showing a chip stack device rearranging unit according to the present embodiment, FIG. 9 is a front view showing the chip stack device rearranging unit according to the present embodiment, and FIG. 10 is a partial cross-sectional view showing a main part of a device pick-and-place unit.

Since the chip stack device is configured by stacking a plurality of chips, the external shape accuracy is poor. Accordingly, even if alignment is performed with reference to the external shape of the chip stack device, the alignment accuracy is poor, which makes probing difficult. Also, the size of each test contact pad on the uppermost side surface of the chip stack device is small. The size of the test contact pad is only 100 μm square or less, and the alignment is difficult.

A chip stack device testing method and a sheet tray for chip stack devices according to the present embodiment are adapted to enable simultaneous testing of a plurality of such chip stack devices.

Specifically, positions of the test contact pads on the uppermost side surface of each of all chip stack devices under test can be disposed accurately, the accurate disposition can be performed repeatedly, and rearrangement, in which the respective chip stack devices are matched with positions of the respective chips of an undiced wafer, can be performed easily.

In the present testing method, a plurality of chip stack devices are fixed and disposed on a sheet-like member that can fix the chip stack devices easily while being aligned one by one. As for a disposing pattern, the chip stack devices are disposed with reference to the chip arrangement of the undiced wafer. At this time, to prevent contact of adjacent chip stack devices, the chip stack devices are disposed with one or two or more spaces inbetween on the aforementioned chip arrangement. In this state, a device test is performed in a similar manner to that of a wafer 24. After the test is finished, the chip stack devices are separated from the sheet-like member and put back on a device tray 31.

Hereinafter, a chip stack device testing method, a chip stack device rearranging unit, and a chip stack device testing apparatus will be described specifically.

[Sheet Tray for Chip Stack Devices]

First, a sheet tray for chip stack devices to be used in a chip stack device testing method will be described. The sheet tray for chip stack devices is a tray for supporting the chip stack devices.

A sheet tray 21 for chip stack devices is configured to include a ring-like frame body 22 and a support sheet 23 attached to the frame body 22 as shown in FIGS. 3 and 4.

The frame body 22 is set to have equal shape and external dimension to those of the undiced wafer 24 (see FIG. 5). It is to be noted that the equal shape and external dimension are equal shape and external dimension in the range in which the frame body 22 can be installed in a sheet tray cassette 51 (see FIG. 6), a test stage 53 (see FIG. 6) of a testing unit 52, and the like so that it can be installed and tested in the testing unit 52 (see FIG. 6) for the wafer 24 in a similar manner to that of the undiced wafer 24. The aforementioned equal shape and external dimension include equal or nearly equal shape and external dimension in the range in which the frame body 22 can be installed in the testing unit 52 in a similar manner to that of the wafer 24.

The frame body 22 is made of a material with a low expansion rate. Specifically, the frame body 22 is made of a material with an equal expansion rate to that of a wafer under test. Similarly, a probe card is made of a material with an equal expansion rate to that of the wafer. Thus, the frame body 22 is made of a material with an equal expansion rate to that of the probe card (not shown) in the testing unit 52. By doing so, in a case where positions of respective probes are displaced due to thermal expansion of the probe card, chip stack devices 25 on the support sheet 23 are displaced in accordance with the displacement of the respective probes to be able to maintain matching between respective contact pads on the uppermost side surface of each of the chip stack devices 25 and the respective probes.

The support sheet 23 is attached to the frame body 22. The support sheet 23 is made of a material such as a synthetic resin having a property of expanding uniformly in accordance with the thermal expansion of the frame body 22. The support sheet 23 is detached from the frame body 22 after completion of a test, and a new support sheet 23 is attached to the frame body 22 by an adhesive, an adhesive tape, or the like for reuse.

The surface of the support sheet 23 is provided with an adhesive layer 26 that attaches and supports the chip stack devices 25. The adhesive layer 26 is a layer for attaching and supporting one or plural chip stack devices 25 so as to match them with positions of respective chips 24A of the undiced wafer 24. The adhesive layer 26 is made of an adhesive having a property of losing adhesion by application of heat, irradiation with UV light, or the like. As the adhesive, one commercially available can be used. One with strong adhesive force is used. The support sheet 23 is made of a thin film and is adapted to support the respective chip stack devices 25 at accurate positions firmly by being mounted on the test stage 53. Also, there is a case in which the support sheet 23 is provided with pin holes (not shown) for lifting up the chip stack devices 25 attached to the adhesive layer 26 from the lower side by lifting pins (not shown) and peeling them off. They may be combined appropriately to facilitate peeling of the chip stack devices 25.

By attaching and fixing the chip stack devices 25 in high accuracy on the detachable adhesive layer 26 of the sheet tray 21 for chip stack devices while image-processing them individually, the sheet tray 21 for chip stack devices can be a substrate under test almost equal to the wafer 24. That is, the sheet tray 21 for chip stack devices having the chip stack devices 25 attached thereon is a substrate under test almost equal to the wafer 24 that is different in thickness but is equal in shape and external dimension to the wafer 24 and whose contact pads are matched with positions of the respective probes of the testing unit 52. The sheet tray 21 for chip stack devices can be installed in the testing unit 52 for testing of the respective chip stack devices 25 in a similar manner to that in the case of testing the wafer 24 to perform measurement of multiple chip stack devices 25 in parallel.

[Chip Stack Device Rearranging Unit]

Next, a chip stack device rearranging unit will be described. A chip stack device rearranging unit 32 (see FIG. 6) is a unit to rearrange a plurality of chip stack devices 25 for testing of the chip stack devices 25. The chip stack device rearranging unit 32 disposes and fixes the chip stack devices 25 on the sheet tray 21 for chip stack devices accurately at certain pitches (each pitch=a pitch of the respective chips 24A of the undiced wafer 24×an integer).

The chip stack device rearranging unit 32 includes a rearranging unit base 33 as a base member, an X-axis stage portion 34 moving the sheet tray 21 for chip stack devices in a direction of the X axis, a Y-axis stage portion 35 moving the sheet tray 21 for chip stack devices in a direction of the Y axis, a rearranging stage 36 attached to the Y-axis stage portion 35 and supporting the sheet tray 21 for chip stack devices, and a device pick-and-place unit 37, as shown in FIGS. 6, 8, 9, and 10.

The device pick-and-place unit 37 is a unit to transfer the chip stack devices 25 from the device tray 31 to the sheet tray 21 for chip stack devices. The device pick-and-place unit 37 includes an X-axis moving mechanism 40, a Y-axis moving mechanism 41, a Z-axis moving mechanism 42, a θ-axis rotating mechanism 43, an adsorbing collet 44, and a mounting table 45.

The X-axis moving mechanism 40, the Y-axis moving mechanism 41, the Z-axis moving mechanism 42, and the θ-axis rotating mechanism 43 are mechanisms to control movement of the adsorbing collet 44 in X, Y, Z, and θ directions. The X-axis moving mechanism 40 to the Z-axis moving mechanism 42 are configured by translatory mechanisms.

The θ-axis rotating mechanism 43 is a mechanism to control rotation of the adsorbing collet 44. The θ-axis rotating mechanism 43 is configured by use of a stepping motor (not shown) or the like.

The adsorbing collet 44 is a member to adsorb and support the chip stack devices 25.

The adsorbing collet 44 includes a transparent body 47, a vacuum connecting port 48, a vacuum seal ring 49, and a vacuum chamber 50. The transparent body 47 is a plate member to make the vacuum chamber 50. An alignment camera 46 images the chip stack device 25 via the transparent body 47 and the vacuum chamber 50 and recognizes a position of the chip stack device 25 for adjustment of the position of the chip stack device 25. The vacuum connecting port 48 is a part to be connected to a pipe from a vacuum pump (not shown). The vacuum seal ring 49 is a member provided at the lower end portion of the vacuum chamber 50 and functioning as a suction disk that prevents vacuum leak when the chip stack device 25 is adsorbed by the vacuum chamber 50. The vacuum chamber 50 is a space communicating with the vacuum pump via the vacuum connecting port 48 to be vacuumized.

The mounting table 45 is a table to mount the device tray 31. The device tray 31 is mounted on the mounting table 45, and the respective chip stack devices 25 in the device tray 31 are transferred to the sheet tray 21 for chip stack devices.

The alignment camera 46 is fixed to the rearranging unit base 33. This alignment camera 46 is a camera to position the chip stack device 25 in X, Y, and θ directions. The alignment camera 46 recognizes an image of the upper surface of the chip stack device 25 through the transparent body 47 and the vacuum chamber 50. Positioning of the device is performed by matching a mark of the uppermost side surface of the chip stack device 25 registered in the alignment camera 46 (a characteristic mark or a mark processed for alignment) with a mark provided at the chip stack device 25 to be rearranged.

[Chip Stack Device Testing Method]

Next, a chip stack device testing method of the present invention with use of the aforementioned sheet tray 21 for chip stack devices and chip stack device rearranging unit 32 will be described. This chip stack device testing method is a method for testing a plurality of chip stack devices 25 simultaneously with use of the aforementioned sheet tray 21 for chip stack devices.

The chip stack device testing method includes a chip stack device rearranging process, a testing process, and a tray housing process as shown in FIG. 6.

The chip stack device rearranging process is a process performed after the chip stack devices 25 are housed in the device tray 31 (see FIG. 7). The wafer 24 is tested in the testing unit 52, thereafter diced, and separated into respective chips 24A, several pieces out of the separated chips 24A are stacked and integrated, and circuits of the respective chips 24A are connected to one another by, for example, a through silicon via (TSV) or the like, to form the chip stack device 25. The chip stack device 25 is housed in the device tray 31. A process following this process is the chip stack device rearranging process.

In the chip stack device rearranging process, the chip stack devices 25 in the device tray 31 are rearranged in the sheet tray 21 for chip stack devices by the chip stack device rearranging unit 32. That is, the respective chip stack devices 25 are matched with positions of the respective chips 24A of the undiced wafer 24 and are rearranged in the sheet tray 21 for chip stack devices.

In the chip stack device rearranging unit 32, the X-axis moving mechanism 40 and the Y-axis moving mechanism 41 of the device pick-and-place unit 37 move the adsorbing collet 44 directly above the device tray 31 mounted on the mounting table 45, and the Z-axis moving mechanism 42 brings the vacuum seal ring 49 of the adsorbing collet 44 into contact with the chip stack device 25 to adsorb this chip stack device 25.

Subsequently, the Z-axis moving mechanism 42 raises the adsorbing collet 44, and the X-axis moving mechanism 40 and the Y-axis moving mechanism 41 move the chip stack device 25 directly below the alignment camera 46. At the same time as starting movement of the adsorbing collet 44, the rearranging stage 36 is moved by an accurate distance based on rearranging information in order to dispose a next chip stack device 25 on the sheet tray 21 for chip stack devices. That is, the rearranging stage 36 is moved by the X-axis stage portion 34 and the Y-axis stage portion 35 so that a position matched with a position of each chip 24A of the undiced wafer 24, which is a position to dispose the chip stack device 25 on the sheet tray 21 for chip stack devices, may be matched with a position directly below the alignment camera 46.

Also, after the chip stack device 25 is moved directly below the alignment camera 46, the alignment camera 46 recognizes an image of the uppermost surface of the chip stack device 25, and the chip stack device 25 is rotated and moved in directions of the X and Y axes so as to correspond to the registered mark to perform alignment of the chip stack device 25. Consequently, the probes of the testing unit 52 that has tested the wafer 24 are matched with the respective contact pads on the uppermost side surface of the chip stack device 25.

Subsequently, the adsorbing collet 44 is lowered by the Z-axis moving mechanism 42, and the chip stack device 25 adsorbed by the adsorbing collet 44 is attached to the adhesive layer 26 of the sheet tray 21 for chip stack devices. Subsequently, vacuumization is stopped to release adsorption by the vacuum chamber 50, and the adsorbing collet 44 is raised.

Here, the positions to dispose the chip stack devices 25 are matched with positions with one space inbetween (hatched positions in FIG. 5) out of the positions of the respective chips 24A of the wafer 24 in FIG. 5. The chip stack devices 25 are attached to the adhesive layer 26 of the sheet tray 21 for chip stack devices in FIG. 3 to be matched with these positions. Consequently, the adjacent chip stack devices 25 are aligned accurately without contacting each other. The aforementioned processing is performed until as many chip stack devices 25 as the number preset in the sheet tray 21 for chip stack devices are attached to the adhesive layer 26 of the sheet tray 21 for chip stack devices. When there is no chip stack device 25 in the device tray 31, the device tray 31 is replaced with a next device tray 31.

Subsequently, the sheet tray 21 for chip stack devices is housed in a sheet tray cassette 51 adjacent to the chip stack device rearranging unit 32 in FIG. 6 in a similar manner to that of the wafer 24. When the sheet trays 21 for chip stack devices are housed in all housing spaces in the sheet tray cassette 51, the sheet tray cassette 51 is delivered to the side of the testing unit 52, and a new sheet tray cassette 51 is prepared.

In the testing process, the sheet trays 21 for chip stack devices in the delivered sheet tray cassette 51 are tested sequentially. At this time, each of the sheet trays 21 for chip stack devices is treated in a similar manner to the wafer 24.

Specifically, as shown in FIG. 6, the sheet tray cassette 51 is installed in the testing unit 52. In the testing unit 52, the sheet tray 21 for chip stack devices in the sheet tray cassette 51 is taken out by a carrying arm (not shown) and is mounted on the test stage 53.

Subsequently, in a similar manner to that in the case of the wafer 24, the sheet tray 21 for chip stack devices is positioned in X, Y, and θ directions to cause the respective probes to be matched with the respective contact pads of the respective chip stack devices 25 on the sheet tray 21 for chip stack devices.

Subsequently, the test stage 53 is raised, and the respective probes and the respective contact pads are brought into contact with each other to perform a test. When the test is finished, the sheet tray 21 for chip stack devices is inserted in the sheet tray cassette 51 on the carrying-out side by the carrying arm. When the sheet trays 21 for chip stack devices are housed in all housing spaces in the sheet tray cassette 51, the sheet tray cassette 51 is delivered to the side of a carrying-out-side device pick-and-place unit 55, and a new sheet tray cassette 51 is prepared.

In the tray housing process, the sheet tray cassettes 51 on the carrying-out side delivered sequentially are set in the carrying-out-side device pick-and-place unit 55.

Here, the carrying-out-side device pick-and-place unit 55 is a unit to transfer the respective chip stack devices 25 on the sheet tray 21 for chip stack devices to the device tray 31 on the carrying-out side. In the carrying-out-side device pick-and-place unit 55, the respective chip stack devices 25 are just transferred to the device tray 31, and thus high accuracy is not required. Thus, the carrying-out-side device pick-and-place unit 55 includes an X-axis moving mechanism 57, a Y-axis moving mechanism 58, a Z-axis moving mechanism 59, an adsorbing collet 61, and an adhesion releasing means (not shown), which are parts of components of the chip stack device rearranging unit 32. The X-axis moving mechanism 57, the Y-axis moving mechanism 58, the Z-axis moving mechanism 59, and the adsorbing collet 61 are similar to the respective mechanisms of the chip stack device rearranging unit 32. The adhesion releasing means is a means to release adhesion from the adhesive layer 26 of the sheet tray 21 for chip stack devices. The adhesion releasing means is configured by a heating unit, a UV emitting unit, a lifting pin, or the like in accordance with the property of the adhesive layer 26.

Accordingly, adhesion of the adhesive layer 26 of the sheet tray 21 for chip stack devices is released by the adhesion releasing means. Subsequently, each of the chip stack devices 25 on the sheet tray 21 for chip stack devices is adsorbed by the adsorbing collet 61 and is transferred to the device tray 31 by the X-axis moving mechanism 57, the Y-axis moving mechanism 58, and the Z-axis moving mechanism 59.

Subsequently, in the sheet tray 21 for chip stack devices, the support sheet 23 is detached from the frame body 22, and a new support sheet 23 is attached to the frame body 22 for reuse.

As described above, since a plurality of chip stack devices 25 are aligned accurately and attached firmly to the support sheet 23 of the sheet tray 21 for chip stack devices via the adhesive layer 26, alignment between the respective contact pads on the upper side surface of each chip stack device 25 and the respective probes of the testing unit 52 can be done easily and accurately. In other words, the chip stack devices 25 can be supported accurately regardless of a difference of the external size of each chip stack device 25.

Since the sheet tray 21 for chip stack devices has equal shape and external dimension to those of the wafer 24, the testing unit 52 for the wafer 24 can be diverted as it is, which enables drastic reduction in running cost.

Also, since the testing unit 52 for the wafer 24 can be diverted as it is, the initial cost for correspondence to a device type of a probe card or the like, the apparatus development cost, and the like can be reduced.

Since as many chip stack devices 25 as the optional number can be attached to the support sheet 23 of the sheet tray 21 for chip stack devices, a plurality of chip stack devices 25 can be tested easily and efficiently. Especially, multiple chip stack devices 25 can be measured simultaneously, which greatly improves the test efficiency.

Also, since a dedicated testing unit to the chip stack devices 25 does not need to be used, which dispenses with carriage to the dedicated testing unit and the like, thus to shorten the handling time and improve the operation efficiency.

The thermal expansion rate of the frame body 22 of the sheet tray 21 for chip stack devices is improved to deal with the temperature change at the time of a test, and thus the test accuracy can be maintained to be high.

Since positions of the contact pads can be kept more accurately than in the tray type, miniaturization of the contact pads can be achieved, which enables reduction in chip unit price.

[Modification Embodiments]

In the above embodiments, although a plurality of chip stack devices 25 are attached to the sheet tray 21 for chip stack devices, only one device can be attached and tested.

Also, in the above embodiments, although the chip stack devices 25 are disposed on the sheet tray 21 for chip stack devices with one space inbetween as shown in FIG. 5, they may be disposed with two or more spaces inbetween. In a case where the external dimension of each chip stack device 25 is accurate, the chip stack devices 25 may be disposed with no spaces in a similar manner to the arrangement of the chips 24A of the wafer 24. In this case as well, similar effects to those in the above embodiments can be exerted.

In the above embodiments, although the testing apparatus has a unit per process with use of the sheet tray cassettes 51 in FIG. 6 for easy understanding of each process, it can be an apparatus that integrates the chip stack device rearranging unit 32, the testing unit 52, and the carrying-out-side device pick-and-place unit 55. That is, it can be a chip stack device testing apparatus testing the chip stack device 25 that integrates the chip stack device rearranging unit 32 matching the chip stack devices 25 each configured by stacking a plurality of chips separated by dicing a substrate under test with positions of the respective chips of the undiced substrate under test and rearranging the chip stack devices 25 in a tray for chip stack devices such as the sheet tray 21 for chip stack devices, the testing unit 52 as a testing unit testing the respective chip stack devices 25 in the tray for chip stack devices, and the carrying-out-side device pick-and-place unit 55 transferring the respective tested chip stack devices 25 in the tray for chip stack devices to the device tray 31. In this case as well, similar effects to those in the above embodiments can be exerted.

In the above embodiments, although the sheet tray 21 for chip stack devices having the support sheet 23 is taken as an example of the tray for chip stack devices, a tray with another configuration, an existing tray, or the like may be used.

The invention claimed is:

1. A chip stack device testing method for testing a chip stack device, said chip stack device being configured by stacking a plurality of chips, and said plurality of chips having been separated by dicing an undiced substrate under test tested in a testing unit by using the testing unit testing the substrate under test, comprising:

using a tray for chip stack devices, said tray having equal shape and external dimension to those of the undiced substrate under test and having an adhesive layer on a surface and placing therein chip stack devices configured by stacking a plurality of chips separated by the dicing;

attaching and supporting one or a plurality of the chip stack devices which are configured by stacking a plurality of chips separated by the dicing to the adhesive layer of the tray for chip stack devices to align the chip stack devices with positions originally arranged of the respective chips of the undiced substrate under test; and installing the tray for chip stack devices in the testing unit having done the test of the substrate under test in a similar manner to that in a test of the undiced substrate under test and testing the respective chip stack devices attached to the adhesive layer in a similar manner to that in a test of the substrate under test.

2. The chip stack device testing method according to claim 1, wherein the respective chip stack devices housed in a device tray are aligned with positions and directions of the respective chips of the undiced substrate under test and are attached to the adhesive layer of the tray for chip stack devices, and the tray for chip stack devices is housed in a cassette in a similar manner to that of the substrate under test and is set in the testing unit, and wherein the respective tested chip stack devices on the tray for chip stack devices are transferred to the device tray.

3. The chip stack device testing method according to claim 1, wherein the respective chip stack devices on the tray for chip stack devices are attached to be aligned with positions with at least one space inbetween on an arrangement of the respective chips of the undiced substrate under test.

4. The chip stack device testing method according to claim 1, wherein the respective chip stack devices are aligned based on a mark provided in each of the chip stack devices.

5. The chip stack device testing method according to claim 1, wherein the tray for chip stack devices includes a frame body having equal shape and external dimension to those of the undiced substrate under test and a support sheet attached to the frame body, and wherein the support sheet is detached from the frame body after completion of a test, and a new support sheet is attached to the frame body for reuse.

6. The chip stack device testing method according to claim 5, wherein the frame body of the tray for chip stack devices is made of a material with a low expansion rate, and the support sheet has a property of expanding uniformly in accordance with thermal expansion of the frame body.

7. A chip stack device rearranging unit rearranging a chip stack device, said chip stack device being configured by stacking a plurality of chips, and said plurality of chips having been separated by dicing an undiced substrate under test tested in a testing unit by using the testing unit testing the substrate under test, comprising:

a rearranging stage supporting a tray for chip stack devices that supports the chip stack device and is installed in the testing unit having done the test of the substrate under test in a similar manner to that in a test of the substrate under test wherein the chip stack devices are configured by stacking a plurality of chips separated by the dicing; and a device pick-and-place unit transferring the chip stack device from a device tray housing the chip stack device which is configured by stacking a plurality of chips separated by the dicing to an adhesive layer of the tray for chip stack devices supported on the rearranging stage to align the chip stack device with an originally arranged position of each chip of the undiced substrate under test.

8. The chip stack device rearranging unit according to claim 7, wherein the tray for chip stack devices includes a frame body having equal shape and external dimension to those of the undiced substrate under test and a support sheet attached to the frame body, and wherein the support sheet is detached from the frame body after completion of a test, and a new support sheet is attached to the frame body.

9. The chip stack device rearranging unit according to claim 8, wherein the frame body is made of a material with a low expansion rate, and wherein the support sheet is made of a material that expands uniformly in accordance with thermal expansion of the frame body.

* * * * *